United States Patent
Colinge et al.

(10) Patent No.: US 10,002,922 B1
(45) Date of Patent: Jun. 19, 2018

(54) PROCESS TO ETCH SEMICONDUCTOR MATERIALS

(71) Applicant: Taiwan Semiconductor Manufacturing Co., Ltd., Hsinchu (TW)

(72) Inventors: Jean-Pierre Colinge, Hsinchu (TW); Carlos H. Diaz, Mountain View, CA (US); Mark Van Dal, Linden (BE)

(73) Assignee: TAIWAN SEMICONDUCTOR MANUFACTURING COMPANY (TW)

( * ) Notice: Subject to any disclaimer, the term of this patent is extended or adjusted under 35 U.S.C. 154(b) by 0 days. days.

(21) Appl. No.: 15/669,064

(22) Filed: Aug. 4, 2017

Related U.S. Application Data

(60) Provisional application No. 62/434,176, filed on Dec. 14, 2016.

(51) Int. Cl.
| | |
|---|---|
| *H01L 21/02* | (2006.01) |
| *H01L 29/06* | (2006.01) |
| *H01L 21/465* | (2006.01) |
| *H01L 29/24* | (2006.01) |
| *H01L 29/66* | (2006.01) |
| *H01L 29/10* | (2006.01) |
| *H01L 29/78* | (2006.01) |

(52) U.S. Cl.
CPC ...... *H01L 29/0673* (2013.01); *H01L 21/0245* (2013.01); *H01L 21/02568* (2013.01); *H01L 21/02617* (2013.01); *H01L 21/02628* (2013.01); *H01L 21/465* (2013.01); *H01L 29/1033* (2013.01); *H01L 29/24* (2013.01); *H01L 29/66969* (2013.01); *H01L 29/785* (2013.01)

(58) Field of Classification Search
CPC ... H01L 21/00; H01L 21/02; H01L 21/02417; H01L 21/02485; H01L 21/02568; H01L 21/02617; H01L 21/02628; H01L 21/465; H01L 21/62; H01L 21/20; H01L 21/06
USPC ........................................................ 438/283
See application file for complete search history.

(56) References Cited

U.S. PATENT DOCUMENTS

| | | | |
|---|---|---|---|
| 8,101,936 B2 * | 1/2012 | Campbell | ........... G11C 13/0011 257/2 |
| 2012/0119177 A1 * | 5/2012 | Erbetta | ................... H01L 45/00 257/2 |

* cited by examiner

*Primary Examiner* — Chuong A Luu
(74) *Attorney, Agent, or Firm* — Sterne, Kessler, Goldstein & Fox P.L.L.C.

(57) ABSTRACT

The present disclosure describes a method which can selectively etch silicon from silicon/silicon-germanium stacks or silicon-germanium from silicon-germanium/germanium stacks to form germanium-rich channel nanowires. For example, a method can include a multilayer stack formed with alternating layers of a silicon-rich material and a germanium-rich material. A first thin chalcogenide layer is concurrently formed on the silicon-rich material, and a second thick chalcogenide layer is formed on the germanium-rich material. The first chalcogenide layer and the second chalcogenide layer are etched until the first chalcogenide layer is removed from the silicon-rich material. The silicon-rich material and the second chalcogenide layer are etched with different etch rates.

20 Claims, 13 Drawing Sheets

US 10,002,922 B1

PROCESS TO ETCH SEMICONDUCTOR MATERIALS

CROSS-REFERENCE TO RELATED APPLICATION

This application claims priority to U.S. Provisional Patent Application No. 62/434,176, filed on Dec. 14, 2016, titled "Process to Etch Semiconductor Materials," which is incorporated herein by reference in its entirety.

BACKGROUND

Halogen gas chemistries exhibit higher etch selectivity for germanium as compared to silicon and can therefore etch germanium faster than silicon. Similarly, halogen gases can etch silicon-germanium faster than silicon, and can etch germanium faster than silicon-germanium. Hence, halogen gas chemistries cannot (i) selectively etch a high-silicon content material from a high-germanium content material, and (ii) separate a germanium layer from silicon layer, a germanium layer from silicon-germanium layer, or a silicon-germanium layer from silicon layer. Such halogen gas chemistries can include fluorine and/or chlorine gasses.

BRIEF DESCRIPTION OF THE DRAWINGS

Aspects of the present disclosure are best understood from the following detailed description when read with the accompanying figures. It is noted that, in accordance with common practice in the industry, various features are not drawn to scale. In fact, the dimensions of the various features may be arbitrarily increased or reduced for clarity of discussion.

DETAILED DESCRIPTION

Figure 1:
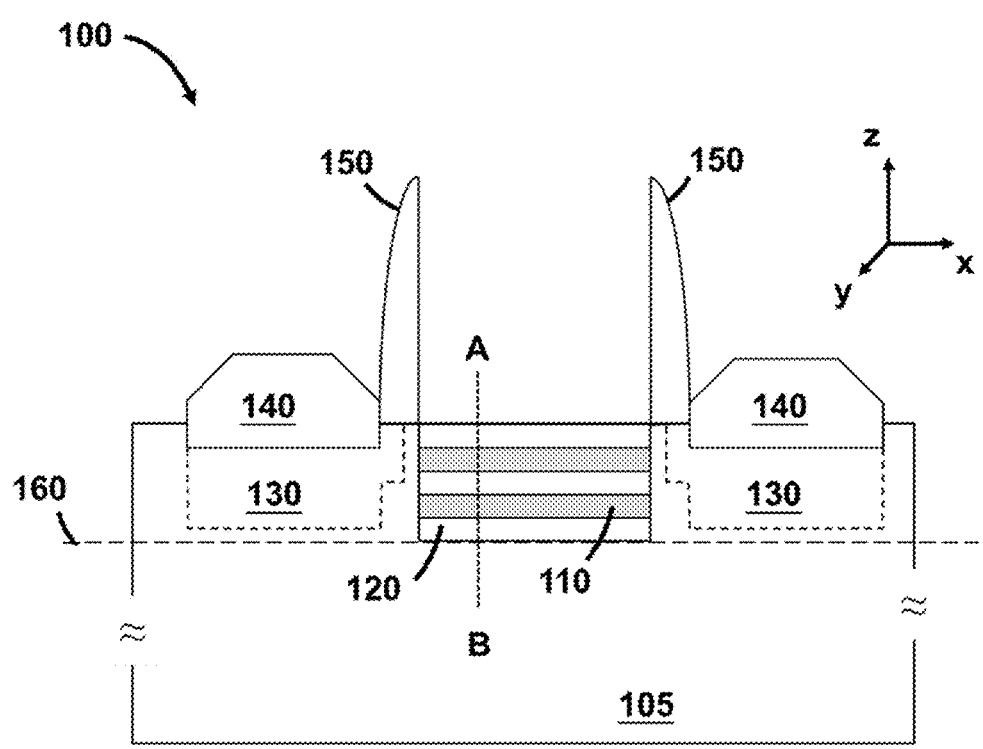
FIG. 1 is an exemplary partially fabricated fin field effect transistor with a multilayer stack between the source/drain regions, according to some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over a second feature in the description that follows may include embodiments in which the first and second features are formed in direct contact, and may also include embodiments in which additional features may be formed that are between the first and second features, such that the first and second features are not in direct contact. In addition, the present disclosure may repeat reference numerals and/or letters in the various examples. This repetition does not in itself dictate a relationship between the various embodiments and/or configurations discussed.

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The term "nominal" as used herein refers to a desired, or target, value of a characteristic or parameter for a component or a process operation, set during the design phase of a product or a process, together with a range of values above and/or below the desired value. The range of values is typically due to slight variations in manufacturing processes or tolerances.

The term "vertical", as used herein, means nominally perpendicular to the surface of a substrate.

The technology described in this disclosure relates to nanowire-based devices, and more particularly, to nanowire-based fin field-effect transistors (finFETs) and techniques for the fabrication thereof. Gate-all-around (GAA) nanowire channel finFETs may enable future scaling beyond the current complementary-metal-oxide semiconductor (CMOS) technology. Nanowire channel finFETs may also be of interest due to their electrostatic properties, which may be improved in comparison to those of conventional finFETs. Nanowires can have, for example, the shape of a bar (e.g., nanobar), a pillar, or a nanosheet.

The fabrication of a nanowire channel finFET may include the formation of a multilayer stack as part of the fin structure. The multilayer stack may include alternating layers of nanowire material and sacrificial material, which can be formed between the source and drain regions of the finFET. The nanowire channel can be formed by selectively removing the sacrificial material from the multilayer stack. For example, a nanowire-based finFET may include a source region, a drain region, and a silicon-rich (Si-rich)/germanium-rich (Ge-rich) multilayer stack that extents between the source and drain regions of the finFET. The Si-rich layer (sacrificial material) can be subsequently removed from the stack with a silicon etch (Si-etch) process. The remaining Ge-rich layers can operate as a nanowire channel.

Halogen gas chemistries exhibit higher etch selectivity for Ge as compared to Si. Halogen gas chemistries can therefore etch Ge faster than Si. Similarly, halogen gases can etch SiGe faster than Si and can etch Ge faster than SiGe. Hence, halogen gas chemistries (i) may not selectively etch a high-Si content material from a high-Ge content material, and (ii) may not have the required etch selectivity to separate a Ge layer from Si layer, a Ge layer from SiGe layer, or a SiGe layer from Si layer, which can be important during the nanowire formation. Such halogen gas chemistries can include fluorine and/or chlorine gasses.

To address the above limitations with respect to Ge and Si selectivity in a nanowire channel finFET fabrication, embodiments described herein are directed to a method that can favor the etch of Si-rich materials over Ge-rich materials. For example, methods which can selectively etch Si from Si/SiGe stacks or SiGe from SiGe/Ge stacks to form Ge-rich channel nanowires. According to some embodiments, a selective etch of a Si-rich material can be accomplished with a sulfurization process that forms a sulfide layer on the exposed surfaces of the Ge-rich material. A purpose of the sulfide layer is to protect the Ge-rich material from a subsequent Si-etch process that removes the Si-rich material from the stack.

FIG. 1 shows an exemplary partially fabricated finFET structure 100 during a replacement metal gate (RMG) process, according to some embodiments. The partially fabricated finFET structure 100 includes, between its source/drain regions 130, a multilayer stack of alternating layers of first material 110 and second material 120 disposed on top of each other. Several iterations of first and second materials, 110 and 120 respectively, are possible as shown in FIG. 1. In some embodiments, the multilayer stack of first and second materials (110 and 120) is etched to form nanowires made of second material 120.

In some embodiments, first material 110 and second material 120 can be layers with different Ge/Si concentrations that can be epitaxially grown on a top portion of fin 105. The multilayer stack can be formed during, or after, the fabrication process of fin 105. Additionally, the multilayer stack can extend through the width of fin 105, e.g., in the y-direction as shown FIG. 1. Partially fabricated finFET structure 100 also includes raised source/drain regions 140 and spacers 150. Raised source/drain regions 140 can be epitaxially grown areas on source/drain regions 130.

At this fabrication stage of the replacement metal gate process, a sacrificial gate stack (not shown), located between spacers 150, have been selectively removed during a previous operation. The sacrificial stack can be replaced with a high dielectric constant material (high-k) and a metal gate electrode in subsequent operations. The high-k dielectric can have a dielectric constant greater than 3.9, according to some embodiments. As would be understood by a person of ordinary skill in the art, after the sacrificial gate stack removal process, the multilayer stack is exposed in the z- and y-directions and can be subjected to further fabrication processes.

In some embodiments, the multilayer stack can be epitaxially grown. Precursor gases that can be used in the epitaxial growth process include, for example, silane ($SiH_4$), disilane ($Si_2H_6$), germane ($GeH_4$), digermane ($Ge_2H_6$), and dichlorosilane ($SiH_2Cl_2$). In some embodiments, first material 110 and second material 120 can be described as $Si_xGe_{1-x}$ and $Si_yGe_{1-y}$ respectively, with $0 \leq x \leq 1$, $0 \leq y \leq 1$, and $x > y$. Therefore, second material 120 can have the highest Ge concentration, and first material 110 can have the highest Si concentration. In some embodiments, the multilayer stack can have a height of at least 100 nm (e.g., in the z-direction) and can include up to 20 stacked layers of alternating first and second material 110 and 120 respectively. In some embodiments, the layer thickness of each first and second material 110 and 120 can range from 6 nm to 20 nm.

In some embodiments, fin 105 can be perpendicular to a surface of a bulk semiconductor wafer or to a surface of a semiconductor on insulator (SOI) wafer. By way of example and not limitation, fin 105 can be made of silicon or another elementary semiconductor such as, for example, (i) germanium; (ii) a compound semiconductor including silicon carbide, gallium arsenide (GaAs), gallium phosphide (GaP), indium phosphide (InP), indium arsenide (InAs), and/or indium antimonide (InSb); (iii) an alloy semiconductor including silicon germanium (SiGe), gallium arsenide phosphide (GaAsP), aluminum indium arsenide (AlInAs), aluminum gallium arsenide (AlGaAs), gallium indium arsenide (GaInAs), gallium indium phosphide (GaInP), and/or gallium indium arsenide phosphide (GaInAsP); or (iv) combinations thereof.

Fin 105 is electrically isolated from neighboring fins with a shallow trench isolation (STI) layer which is not shown in FIG. 1 for clarity. The STI layer can be a dielectric layer, such as silicon oxide. Line 160 of FIG. 1 outlines the height of the STI layer relative to fin 105 and the multilayer stack of first and second materials 110 and 120. Based on FIG. 1, the multilayer stack is positioned on a portion of fin 105 which is above the STI. Fin 105 below line 160 can be a Si-rich material that will not be removed during Si-etch. As would be understood by a person of ordinary skill in the art, this is possible because the STI layer covers and protects the Si-rich portion of fin 105 during the Si-etch.

Figure 2:
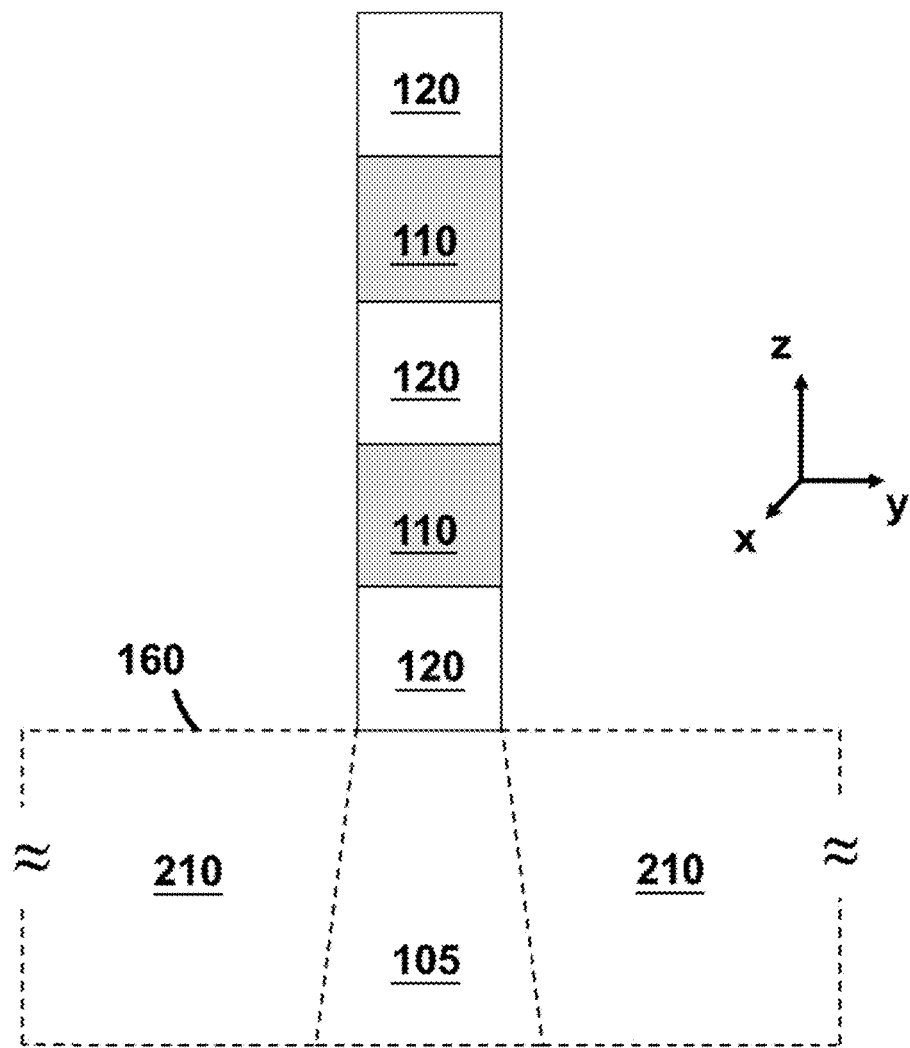
FIG. 2 is a cross-sectional view of an exemplary multilayer stack of a partially fabricated fin field effect transistor, according to some embodiments.

FIG. 2 is a cross-sectional view of exemplary finFET structure 100 taken along line AB of FIG. 1, according to some embodiments. In this depiction, fin 105 is viewed along its width in the y-direction of FIG. 1. In this view, STI layers 210 are visible on each side of fin 105. As discussed above, below STI line 160, fin 105 can be made of a Si-rich material. For example, fin 105 can be made of crystalline silicon. Further, the multilayer stack with first material 110 and second material 120 is grown in the portion of fin 105 above the STI line 160. Both materials 110 and 120 may contain Si and Ge, respectively; however, second material 120 can have the highest Ge concentration relative to first material 110, and first material 110 can have the highest Si concentration relative to second material 120.

Figure 3:
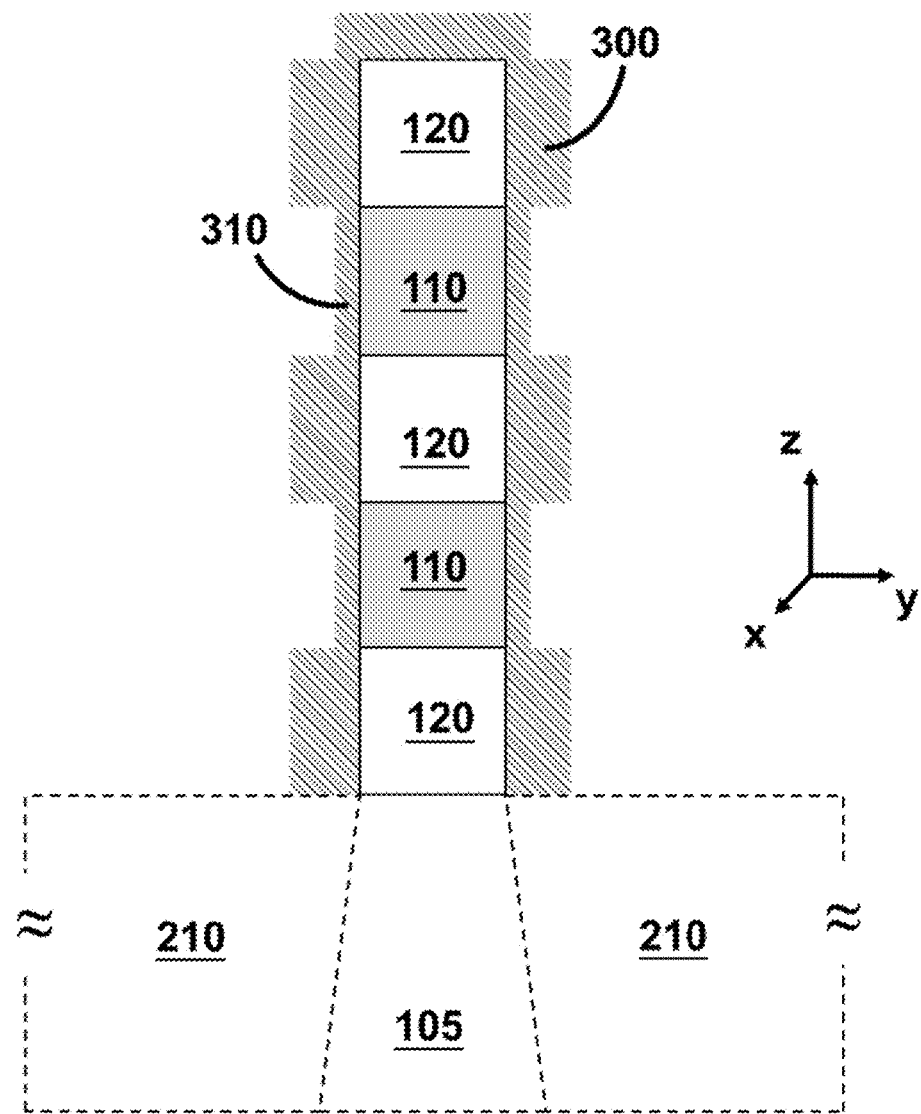
FIG. 3 is a cross-sectional view of an exemplary multilayer stack of a partially fabricated fin field effect transistor with sulfide layers formed of first and second materials, according to some embodiments.

FIG. 3 shows the structure of FIG. 2 after an exemplary sulfurization process, according to some embodiments. During the sulfurization process, an etch-protective sulfide layer is formed on the exposed surfaces of first and second materials 110 and 120. In some embodiments, the sulfurization process may use a hydrogen sulfide ($H_2S$) or an ammonium sulfide (($NH_4)_2S$) chemistry to form a germanium disulfide ($GeS_2$) (sulfide) layer on the materials of the multilayer stack which contain Ge. By way of example and not limitation, the sulfide growth can be accomplished with exposure of the stack to $(NH_4)_2S$ vapors, to an $(NH_4)_2S$ solution, or to an anneal in a $H_2S$ ambient. Sulfur belongs to a group of elements (e.g., elements of group 16 of the periodic table) which are referred to as the chalcogen family.

Other elements of the chalcogen family can be used to form an etch-protective layer on Ge containing materials of the multilayer stack. Exemplary chalcogen elements that can be used—in addition to sulfur (S)—are selenium (Se) and tellurium (Te). Subsequently, germanium selenide (GeSe) or germanium telluride (GeTe) can be formed as an alternative to $GeS_2$. In this context, a "chalcogenization" process can be performed to grow an etch-protective Ge chalcogenide (thereafter "chalcogenide") layer on a material with sufficient Ge concentration. Therefore, exemplary chalcogenide layers can be $GeSe_2$, $GeTe_2$, or $GeS_2$.

For example purposes, the formation of chalcogenide layers will be described in the context of sulfide layers. FIGS. 3-7 and FIGS. 9-12 describe the formation of example sulfide layers. Based on the disclosure herein, a person of ordinary skill in the art will recognize that other types of chalcogenide layers can be formed. These other types of chalcogenide layers are within the spirit and scope of this disclosure.

In the example of FIG. 3, sulfide layer 300 is formed on second material 120, and sulfide layer 310 is formed on first material 110. In some embodiments, sulfide layer 300 can be thicker than sulfide layer 310. In some embodiments, sulfide layer 300 can have a higher growth rate than sulfide layer 310 under certain growth conditions. In some embodiments, the sulfide growth rate can depend on the Ge concentration of the underlying material and the growth temperature. For instance, the sulfide growth can be promoted for Ge-rich materials when the growth occurs in specific temperature ranges. By way of example and not limitation, the temperature range for a sulfurization process in an $(NH_4)_2S$ solution can be between 20° C. and 100° C., while the temperature range for a sulfurization process in an annealing furnace with $H_2S$ vapors can be between 200° C. and 800° C. As a result, the sulfide layer thickness for materials with different Ge concentrations can be controlled through a process temperature tuning. Hence, a thinner sulfide layer can be formed on materials with lower Ge concentration, and a thicker sulfide layer can be formed on materials with higher Ge concentration. Consequently, on second material 120, where the Ge concentration is higher, a thicker sulfide layer 300 can be formed under the appropriate growth conditions. In some embodiments, the sulfide layer thickness can be less than 4 nm.

In some embodiments, the selection of the aforementioned process conditions is by design and is aimed to create a thickness offset between sulfide layers 300 and 310. This is an important aspect for a subsequent etch process step, where both sulfide layers will be subjected to the same etch chemistry. In addition, in some embodiments, the sulfide layer can passivate, or cover, the Ge-rich surface more efficiently than the Si-rich surface. As a result of this surface coverage difference, sulfide layers 300 and 310 may exhibit different density values and different etch rates when exposed to a common etch chemistry. For example, sulfide layer 300 can have higher density and lower etch rate than sulfide layer 310. Therefore, at the end of the sulfide growth process, sulfide layers 300 and 310 can have different thicknesses and different etch rates.

Once the sulfide growth process is over, the Si-etch process may begin. In some embodiments, an objective of the etch process is to remove Si-rich material 110 without removing Ge-rich material 120. In some embodiments, this can be accomplished in part because of the thickness offset between sulfide layers 300 and 310. For example, when the etch process begins, both sulfide layers 300 and 310 can be removed at the same rate, according to some embodiments. Due to the thickness offset between the sulfide layers, sulfide layer 310 is removed earlier, while sulfide layer 300 is partially etched. From this point forward, the etch process etches the Si-rich material 110 while the etch process continues to etch sulfide layer 300. In some embodiments, and for a given etch chemistry, the etch rate (ER) relationship between the Si-rich material, the sulfide layer, and the Ge-rich material can be described as:

ER for Si-rich>ER for Sulfide>ER for Ge-rich

As explained above, the sulfide layer 310 can have a higher density than sulfide layer 300 and therefore exhibit a higher etch rate than sulfide layer 300. This relationship ensures that the etch selectivity of the Ge-rich material is the lowest among the materials exposed to the etch chemistry.

The Si-etch process can be either a dry etch process that uses gas etchants, a wet etch process that uses etchants diluted in a solution, or a combination thereof. Furthermore, the Si-etch process may use the same or different etch chemistries for each target material. In some embodiments, a single-gas dry etch process can be chlorine-based or fluorine-based. In some embodiments, a wet etch process, like an ammonium hydroxide ($NH_4OH$) alkaline solution, can be used to remove the sulfide layer; and a dry etch chemistry can be used to etch the Si-rich material.

Once the sulfide layer on Si-rich, first material 110 has been removed, the Si-etch process begins to etch the underlying first material 110 while it continues to etch sulfide layer 300. In some embodiments, the etch rate for first material 110 can be higher than the etch rate for sulfide layer 300. In other words, the etch chemistry is designed to be more selectivity towards Si-rich materials, like material 110. The Si-etch process can etch material 110 and sulfide layer 300 until sulfide layer 300 reaches a thickness of about 0.5 nm to 2 nm, at which point the etch process can be terminated. The termination of the etch process at sulfide layer 300 thickness of about 0.5 nm to 2 nm, can ensure that second material 120 is not etched due to an etch process time miscalculation. By way of example and not limitation, the Si-etch process can be timed based on the initial thickness of sulfide layer 300 and the etch rate of the sulfide layer.

Sulfide layer growth rate and etch rate information for each sulfide growth condition and etch chemistry combination can be obtained by experimentation. For example, a person of ordinary skill in the art would be able to determine the sulfide layer's growth rate in Å/s by taking the ratio of the physical thickness of the grown sulfide—which can be obtain by means of transmission electron microscope (TEM) imaging—over the growth process time in seconds. The etch rate can be obtained in Å/s by measuring the physical thickness of the grown sulfide (initial thickness), subject the sulfide to the etch chemistry for a predetermined amount of etch time, re-measure the physical thickness of the etched sulfide layer (final thickness), and calculate the etched amount in Å. The etched amount is the difference between initial and final physical thickness of the sulfide layer. A person of ordinary skill in the art would be able to determine the etch rate of the sulfide layer by taking the ratio of the etched sulfide amount in Å, over the etch time in seconds.

Figure 4:
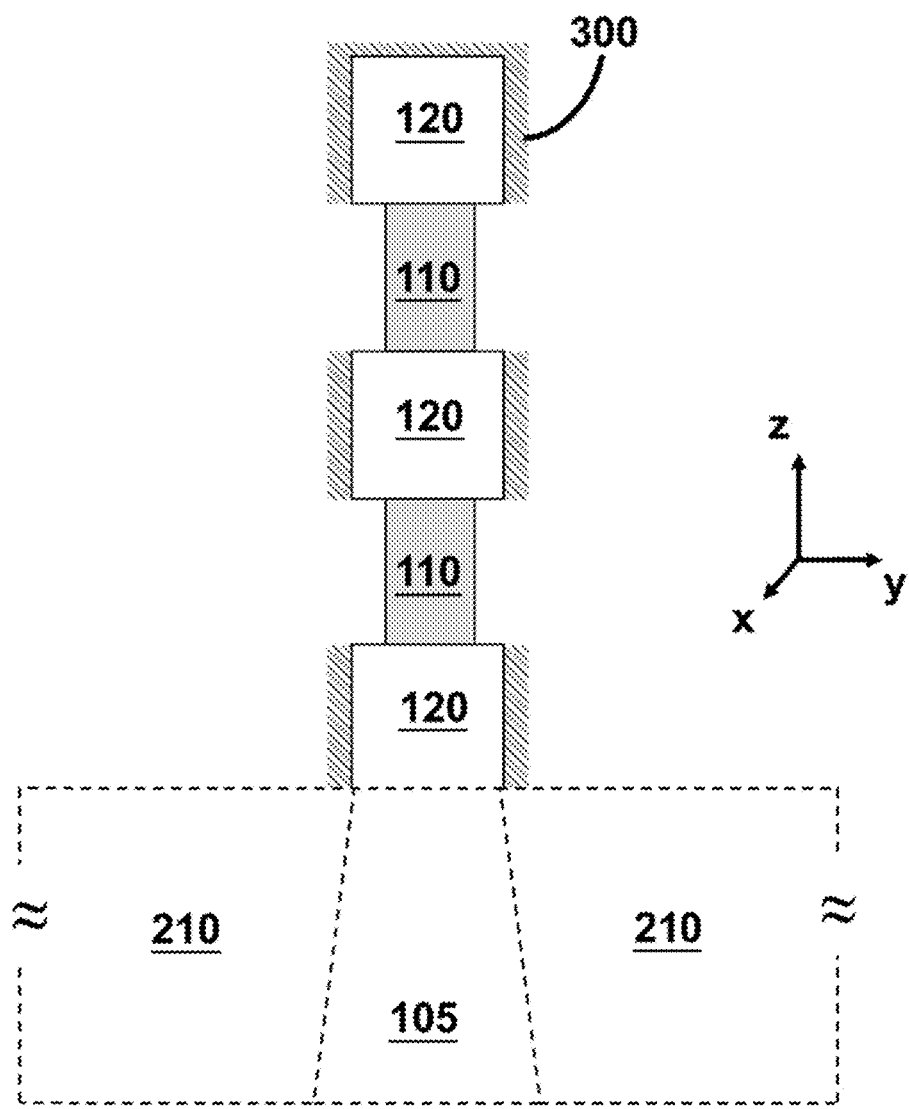
FIG. 4 is a cross-sectional view of an exemplary multilayer stack of a partially fabricated fin field effect transistor with a partially etched first material, according to some embodiments.

FIG. 4 shows the multilayer stack of FIG. 3 after an exemplary Si-etch process, according to some embodiments. At this stage, sulfide layer 310 has been removed by the etch process while first material 110 and sulfide layer 300 have been partially etched. As discussed above, the Si-etch process can etch first material 110 and sulfide layer 300 until the sulfide layer 300 reaches a thickness of about 0.5 nm to 2 nm. As would be understood by a person of ordinary skill in the art, the thickness range provided for sulfide layer 300 is not intended to be limiting and depends on the established etch rates and selectivity values of the etch chemistry.

Figure 5:
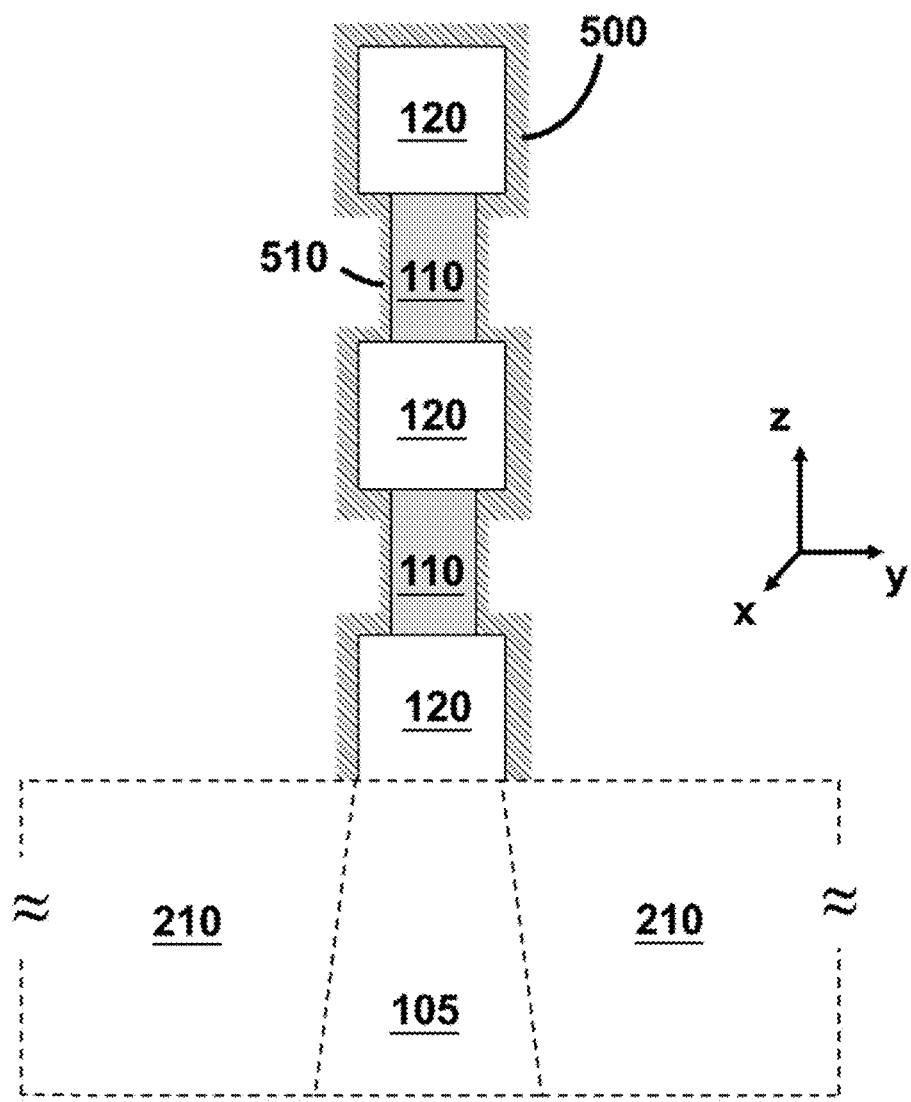
FIG. 5 is a cross-sectional view of an exemplary multilayer stack of a partially fabricated fin field effect transistor with sulfide layers re-formed of its first and second materials, according to some embodiments.

When the Si-etch process is terminated, a second sulfurization operation "re-grows" sulfide layers on first material 110 and second material 120. Referring to FIG. 5, sulfide layer 500 forms on second material 120 and a sulfide layer 510 forms on first material 110. As would be understood by a person of ordinary skill in the art, sulfide layer 500 can be formed over existing partially etched sulfide layer 300, while sulfide layer 510 can be formed on the partially etched Si-rich material 110. For similar reasons discussed above, at the end of the second sulfide layer growth, a thickness offset exists between sulfide layer 500 and sulfide layer 510. For example, the thickness offset can be at least 0.5 nm to 2 nm, which is approximately the thickness of sulfide layer 300 at the end of the etch process of FIG. 4.

Figure 6:
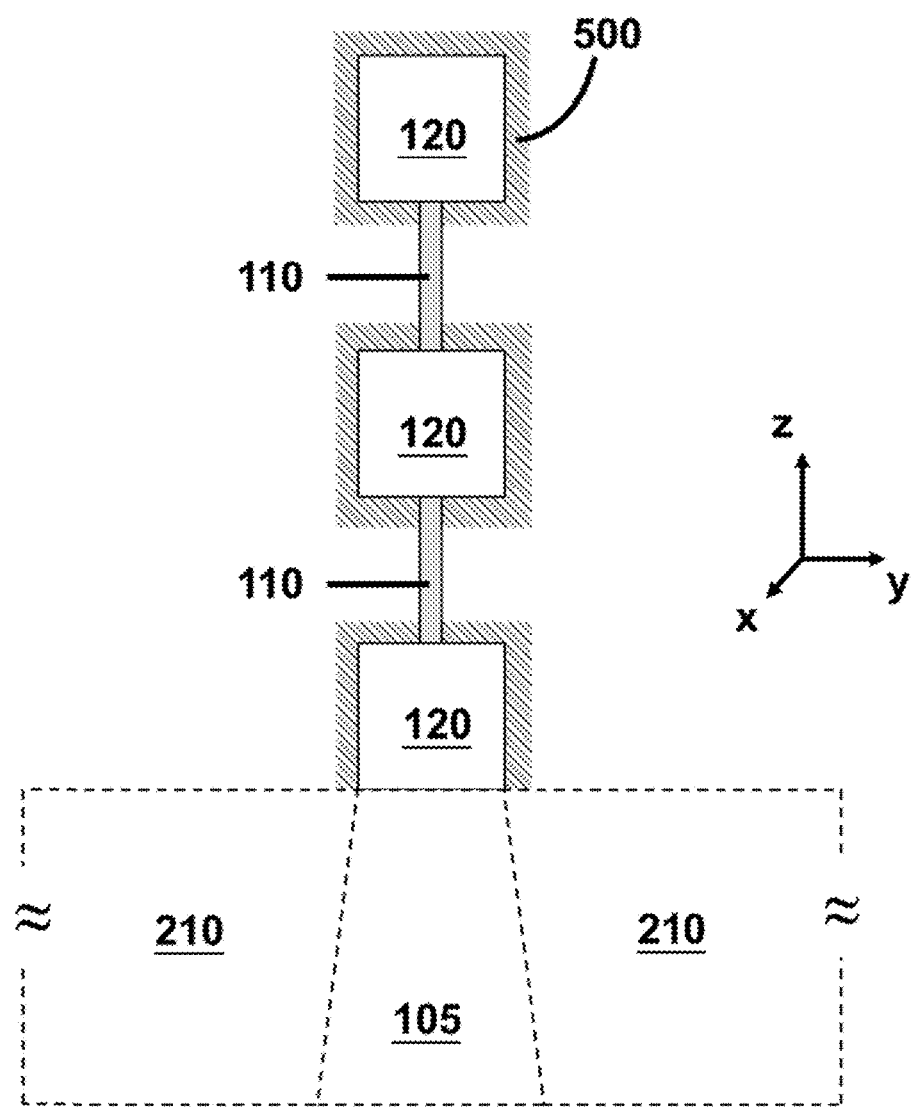
FIG. 6 is a cross-sectional view of an exemplary multilayer stack of a partially fabricated fin field effect transistor with substantially etched first material, according to some embodiments.

The Si-rich material removal process continues with the introduction of a second Si-etch process. For example in FIG. 6, the second Si-etch removes sulfide layer 510 and continues to etch the underlying Si-rich first material 110 and the remaining sulfide layer 500. As shown in FIG. 6, Si-rich first material 110 can be substantially removed at this stage of the etch process. As discussed above, the Si-etch process can be terminated when sulfide layer 500 reaches a thickness of about 0.5 nm to 2 nm. As would be understood by a person of ordinary skill in the art, the silicon etch process time can be adjusted based on the initial thickness and etch rate of sulfide layer 500.

Figure 7:
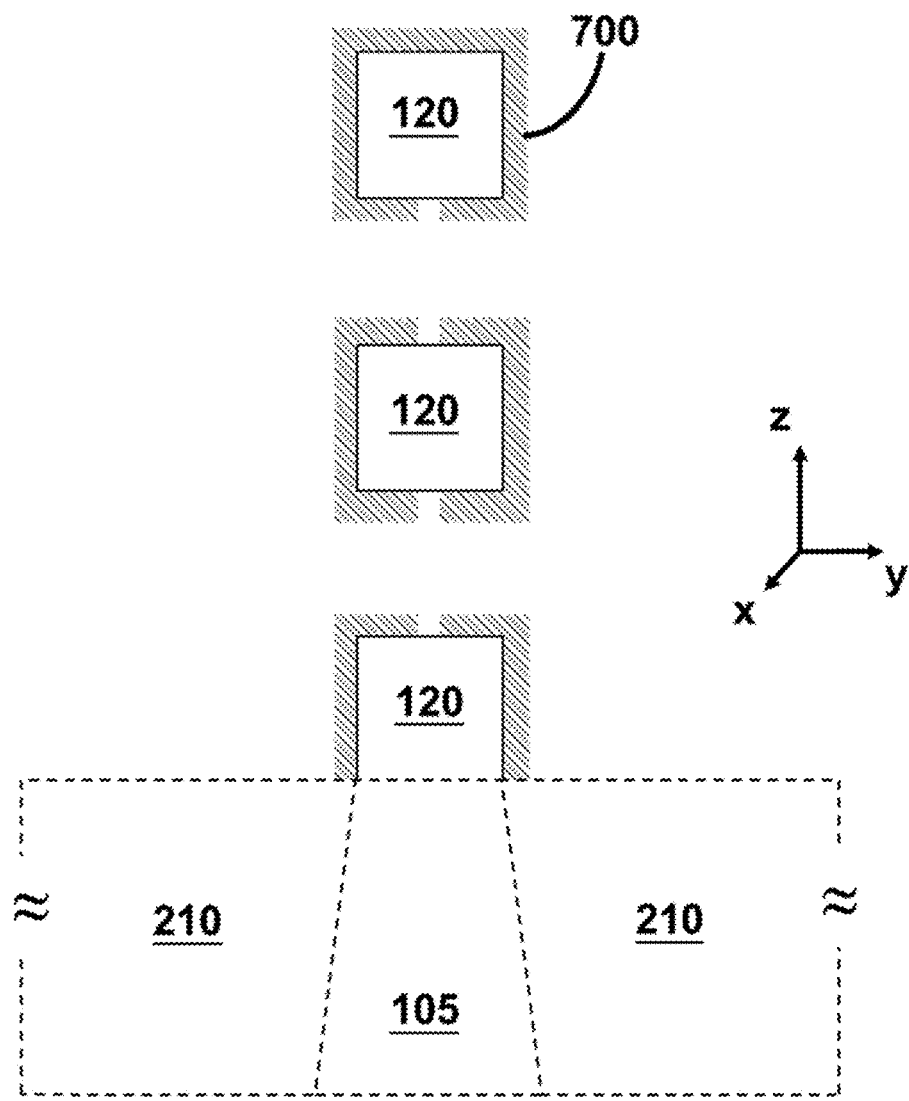
FIG. 7 is a cross-sectional view of an exemplary multilayer stack of a partially fabricated fin field effect transistor with a first material removed, according to some embodiments.

In some embodiments, Si-rich first material 110 can be removed before sulfide layer 500 reaches a thickness of about 0.5 nm to 2 nm. Referring to FIG. 7, Si-rich first material 110 has been removed by the Si-etch process, leaving behind the Ge-rich second material 120 with the remaining sulfide layer 700. The remaining sulfide layer 700 covers exposed surfaces of second material 120 except the locations where the first and second materials were in contact during the etch. In subsequent process operations, the remaining sulfide layer 700 can be removed with another cycle of etch. This is possible because the sulfide etch rate can be greater than the Ge-rich etch rate, as discussed above.

As would be understood by a person of ordinary skill in the art, several etch-growth-etch cycles may be necessary to remove Si-rich material 110. The number of cycles can be based on, for example, the physical thickness of the sulfide layers, their offset thickness, their respective etch rates, the etch rate selectivity. However, as would be understood by a person of ordinary skill in the art based on this disclosure, the greater the thickness offset between the two sulfide layers, the fewer the etch-growth-etch cycles required to remove the Si-rich material.

Figure 8:
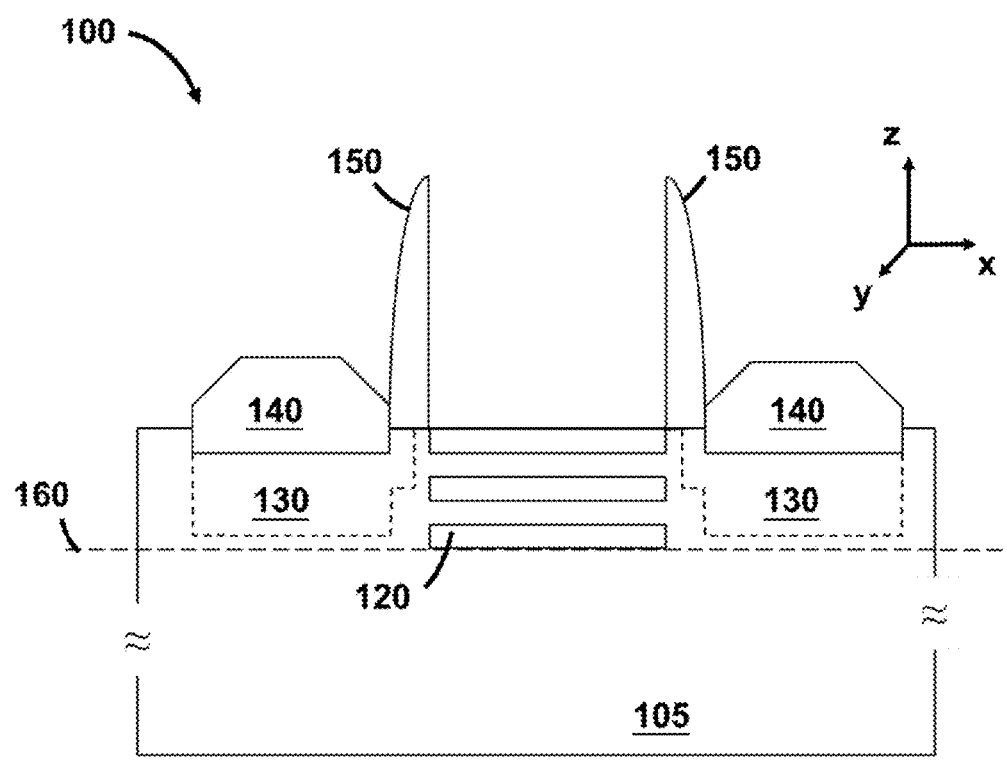
FIG. 8 is an exemplary partially fabricated fin field effect transistor with a germanium-rich nanowire channel, according to some embodiments.

FIG. 8 shows the partially fabricated finFET structure 100 after the removal of Si-rich material 110 and the subsequent removal of the remaining sulfide layer 700 from second material 120. At this stage, the multilayer stack has been transformed to "separated" Ge-rich nanowires located between source/drain regions 130 of the exemplary partially fabricated finFET structure 100. According to some embodiments, the empty space between the Ge-rich nanowires can be filled with high-k and MG electrode material to form a GAA nanowire finFET.

Figure 9:
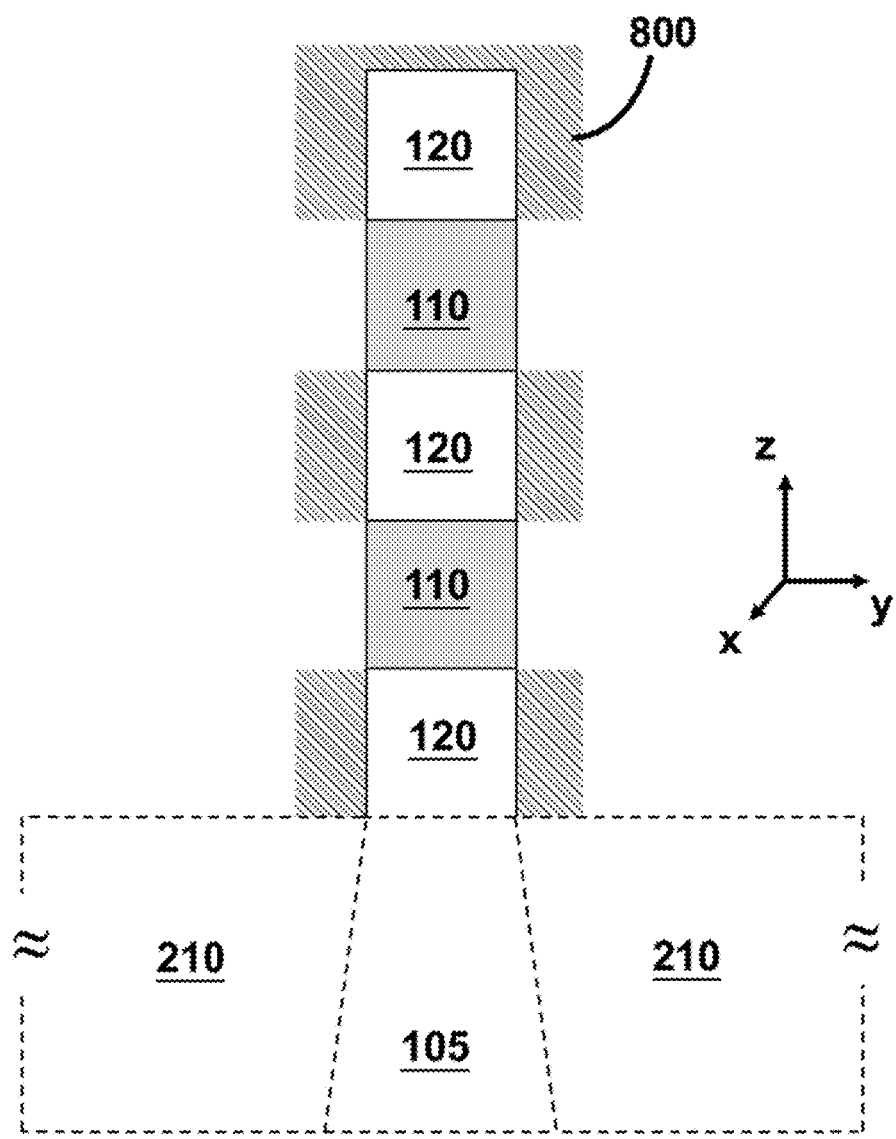
FIG. 9 is a cross-sectional view of an exemplary multilayer stack of a partially fabricated fin field effect transistor with a sulfide layer formed of a germanium-rich second material, according to some embodiments.

FIG. 9 shows a case of the multilayer stack of FIG. 2 where the first material 110 is substantially germanium-free Si, and the second material 120 is SiGe. Based on the sulfide growth characteristics discussed earlier, during the sulfurization process sulfide layer 800 grows on Ge-rich second material 120 because there is little or no Ge to react in the substantially germanium-free Si first material 110.

Figure 10:
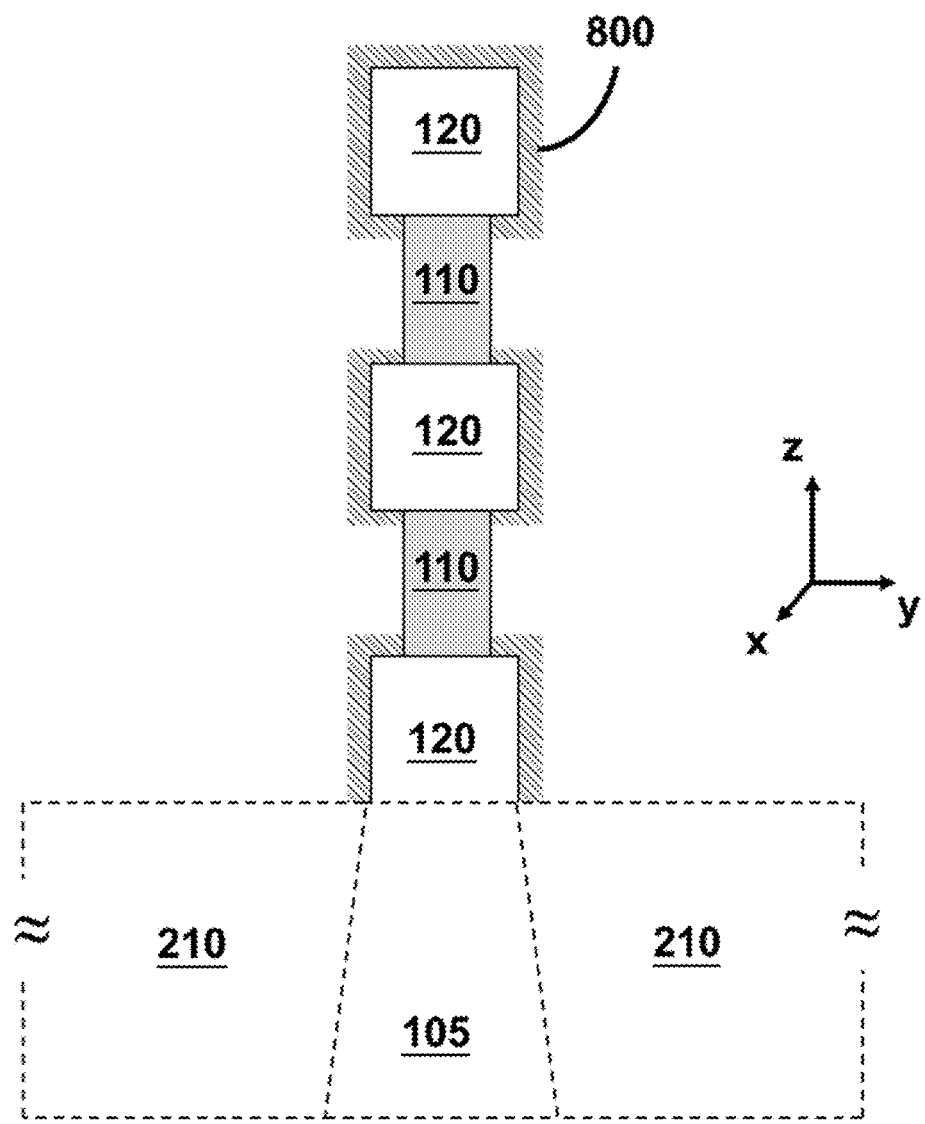
FIG. 10 is a cross-sectional view of an exemplary multilayer stack of a partially fabricated fin field effect transistor with a first material partially etched, according to some embodiments.
Figure 11:
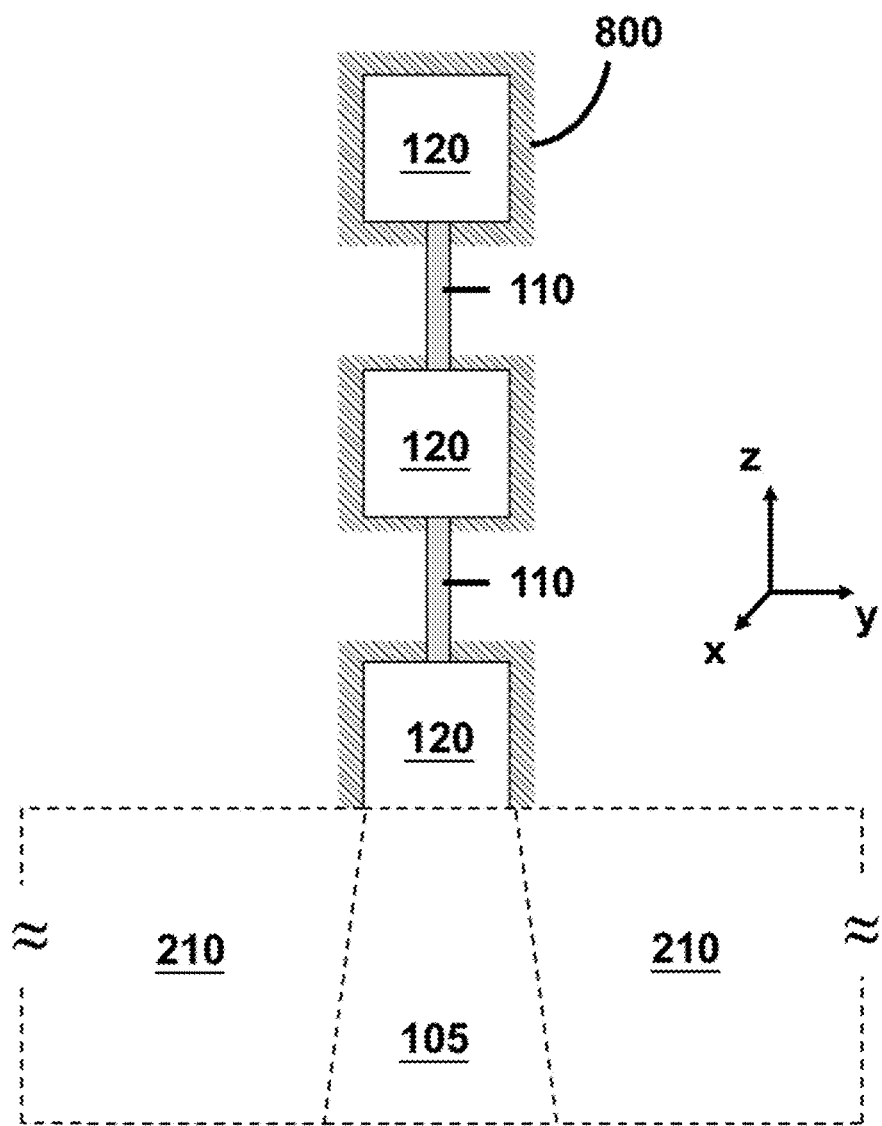
FIG. 11 is a cross-sectional view of an exemplary multilayer stack of a partially fabricated fin field effect transistor with a first material substantially etched, according to some embodiments.

Referring to FIG. 10, during the subsequent Si-etch process, the substantially germanium-free first material 110 is substantially etched, and sulfide layer 800 is partially etched. The Si-etch may continue until sulfide layer 800 reaches a predetermined target thickness (e.g., between 0.5 nm to 2 nm) as shown in FIG. 11. If first material 110 is not removed before the Si-etch process is terminated, multiple cycles of sulfurization and Si-etch processes may be required. However, as would be understood by a person of ordinary skill in the art, the number of etch-growth-etch cycles in this case can be fewer than the embodiments discussed above-FIGS. 2-7—where the first and second materials contained Ge.

Figure 12:
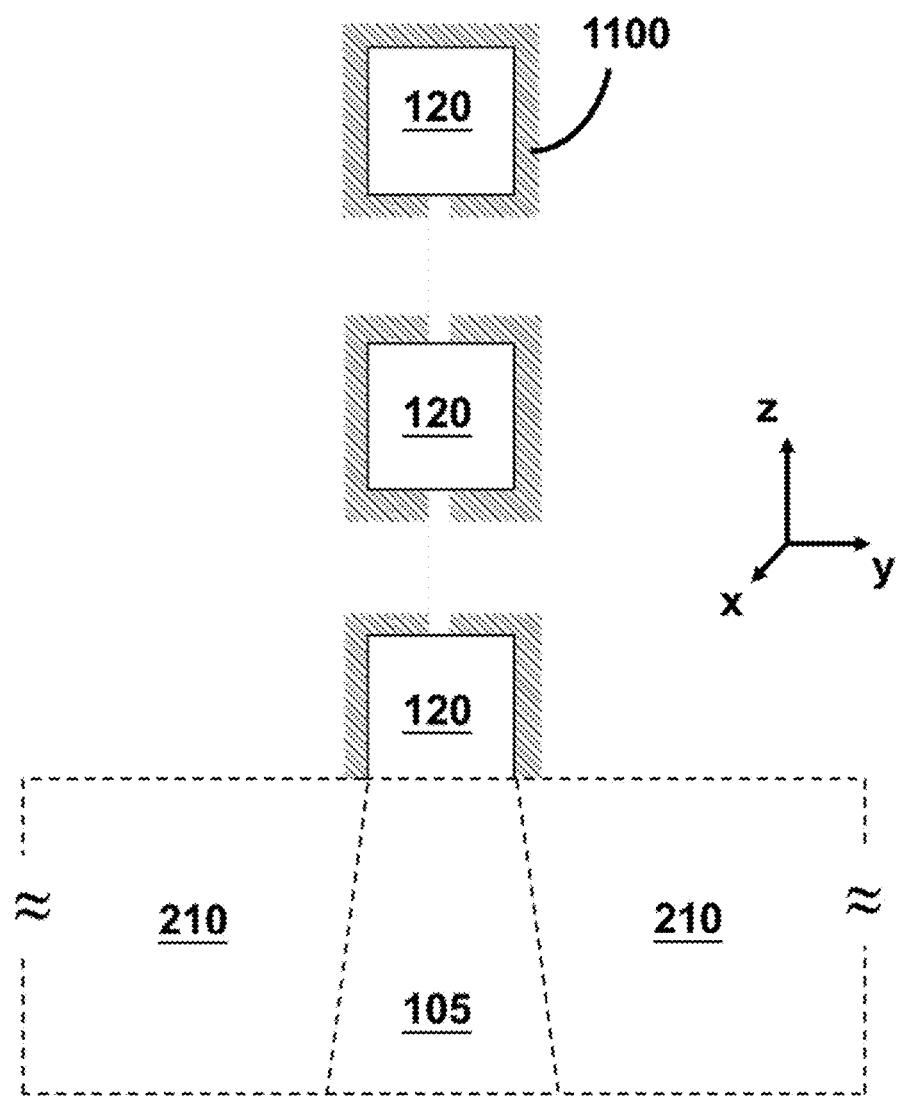
FIG. 12 is a cross-sectional view of an exemplary multilayer stack of a partially fabricated fin field effect transistor with a first material removed, according to some embodiments.

FIG. 12 shows the remaining SiGe nanowire (second material) 120 with a remaining sulfide layer 1100. The remaining sulfide layer 1100 covers exposed surfaces of second material 120 except the locations where the two materials were in contact during the etch. The remaining sulfide layer 1100 can be subsequently removed with another etch operation so that the Ge-rich nanowires are free from the sulfide layer. At the end of this process, partially fabricated finFET structure 100 would look similar to the structure shown in FIG. 8.

Figure 13:
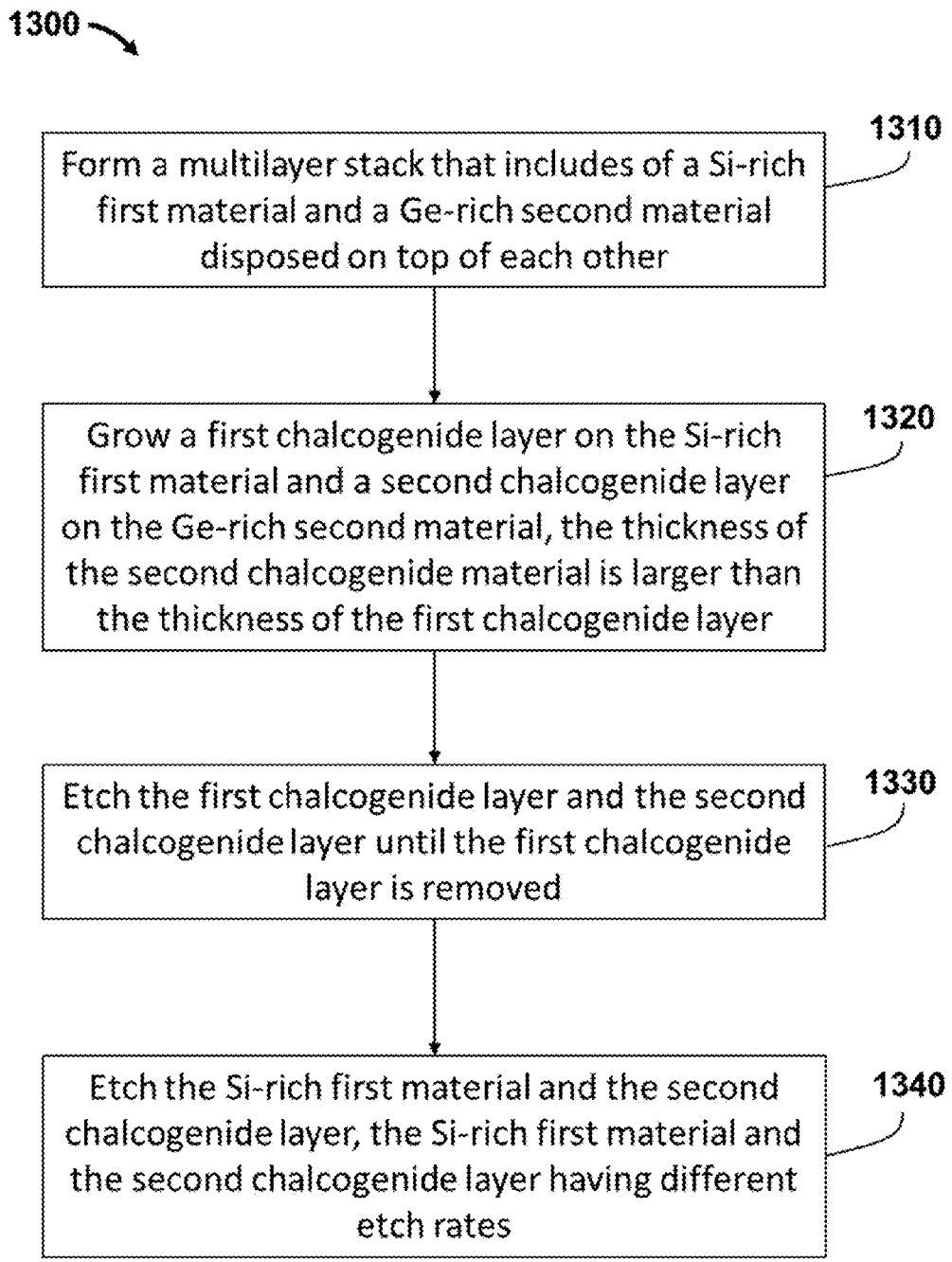
FIG. 13 is a flow chart of an exemplary fin field effect transistor fabrication method, according to some embodiments.

FIG. 13 shows a flow chart diagram of an exemplary fabrication process 1300 that utilizes an exemplary etch process to separate Si-rich material from Si-rich/Ge-rich stacks, according to some embodiments. This exemplary fabrication process is not limited to the operations shown in exemplary fabrication process 1300. The Si-rich/Ge-rich stacks can be multilayer stacks that include a combination of a first material $Si_xGe_{1-x}$ and a second material $Si_yGe_{1-y}$, where $0 \leq x \leq 1$, $0 \leq y \leq 1$, and x>y. In other words, the second material can have the highest Ge content, and the first material can have the highest Si content.

Exemplary process 1300 begins with operation 1310 and the formation of a multilayer stack that includes alternating Si-rich first and Ge-rich second materials with different Si and Ge concentrations. FIG. 1 shows such an exemplary multilayer stack formed between the source/drain regions 130 of a partially fabricated finFET 100. The exemplary multilayer stack includes a first material 110 and a second material 120 disposed on top of each other. In some embodiments, a third material (other than second material 120) can be grown on first material 110, and second material 120 can be grown above the third material. Additionally, a third material (other than first material 110) can be grown on second material 120, and first material 110 can be grown above the third material. For example, such a third material can be a native oxide. In some embodiments, first material 110 and second material 120 of the multilayer stack can be formed on the top portion of fin 105. In some embodiments, the multilayer stack with the first and second materials (110 and 120) can be formed during or after the fabrication process of fin 105 and can extend throughout the width of fin 105 (e.g., y-direction).

By way of example and not limitation, the multilayer stack can be formed using epitaxial growth. Precursor gases used in the epitaxial growth process may include silane (SiH$_4$), disilane (Si$_2$H$_6$), germane (GeH$_4$), digermane (Ge$_2$H$_6$), and dichlorosilane (SiH$_2$Cl$_2$). In some embodiments, the multilayer stack can have a height of at least 100 nm (e.g., in the z-direction), and can include up to 20 stacked layers of alternating first and second materials 110 and 120 respectively. In some embodiments, the layer thickness for each material can range from 6 nm to 20 nm.

Exemplary process 1300 continues with operation 1320 where an exemplary chalcogenization process can form an etch-protective chalcogenide layer on both first and second materials of the multilayer stack. In some embodiments, the etch protective chalcogenide layer can have a slower etch rate during an exemplary etch process. The chalcogenide layer can cover the exposed surfaces of each material of the multilayer stack. Exemplary chalcogen elements that can be used are S, Se and Te. Therefore, GeS$_2$, GeSe$_2$, or GeTe$_2$ chalcogenide layers can be formed on each material of the multilayer stack with Ge content. In the case of sulfide layers (GeS$_2$), the sulfide growth can be achieved by exposing the materials to (NH$_4$)$_2$S vapors or annealing them in the presence of H$_2$S. Alternatively, the sulfurization agent can be a solution of (NH$_4$)$_2$S.

Referring to FIG. 3, sulfide layer 300—an example of a chalcogenide layer—can be formed on second material 120, and sulfide layer 310 can be formed on first material 110. In some embodiments, sulfide layer 300 is thicker than sulfide layer 310. In some embodiments, sulfide layer 300 can have a higher growth rate than sulfide layer 310 under specific growth conditions. In fact, the sulfide growth rate can depend on the Ge concentration of the underlying material and the growth temperature. For example, the sulfide growth can be promoted for Ge-rich materials when the growth occurs within a specific temperature range. As an example, for a sulfurization process in an (NH$_4$)$_2$S solution, the specific temperature range can be between 20° C. and 100° C., while for a sulfurization process in an annealing furnace in the presence of H$_2$S vapors the specific temperature range can be between 200° C. and 800° C. As a result, the sulfide growth on materials with different Ge concentrations can be controlled through a process temperature tuning. Consequently, thinner sulfide layers can be formed on materials with lower Ge concentration, and a thicker sulfide layers can be formed on materials with higher Ge concentration. Therefore, on second material 120, where the Ge concentration is higher, a thicker sulfide layer 300 can be formed under the appropriate growth conditions. In some embodiments, the sulfide layer thickness can be below 4 nm. However, the thickness of the sulfide layer has can be selected based on the etch process.

In addition, in some embodiments, the sulfide layer can passivate, or cover, the Ge-rich surface more efficiently than the Si-rich surface. As a result of this surface coverage difference, sulfide layers 300 and 310 may exhibit different density values and different etch rates when exposed to a common etch chemistry. For example, sulfide layer 300 can have higher density and lower etch rate than sulfide layer 310. Therefore, at the end of the sulfide growth process, sulfide layers 300 and 310 can have different thicknesses and different etch rates.

In operation 1330, an exemplary Si-etch process is introduced to remove Si-rich material 110 without etch the Ge-rich material 120. This can be accomplished in part because of the thickness offset between sulfide layers 300 and 310. Assuming that both sulfide layers 300 and 310 can be removed at the same rate, sulfide layer 310 is removed first due to the thickness offset. At the end of the etch cycle, sulfide layer 300 is partially removed while sulfide layer 310 is removed from first material 110.

According to some embodiments, the Si-etch process can be either a dry etch process that uses gas etchants, a wet etch process that uses soluble etchants, or a combination thereof. Furthermore, the Si-etch process may use the same or different etch chemistries for each target material. For example, a single-gas dry etch process can be chlorine or fluorine-based. In some embodiments, a wet etch process (e.g., NH$_4$OH alkaline solution) can be used to remove the sulfide layer, while a dry etch chemistry (e.g., chlorine or fluorine based) can be used to etch the Si-rich material.

In operation 1340, once the first sulfide layer is removed, the etch process begins to remove the Si-rich material 110 while it continues to etch sulfide layer 300. In some embodiments, and for a given etch chemistry, the etch rate relationship between the Si-rich material, the chalcogenide layer, and the Ge-rich material can be described as:

ER for Si-rich>ER for chalcogenide>ER for Ge-rich

As explained above, the sulfide layer 310 can have a higher density than sulfide layer 300 and therefore exhibit a higher etch rate than sulfide layer 300. This relationship ensures that the etch selectivity of the Ge-rich material is the lowest among the materials exposed to the etch chemistry.

According to the aforementioned relationship, the etch rate for first material 110 is higher than the etch rate for sulfide layer 300. In other words, the etch chemistry is designed so that the selectivity for Si-rich materials is higher, like for material 110. The Si-etch process etches material 110 and sulfide layer 300 until the sulfide layer 300 reaches a thickness of about 0.5 nm to 2 nm, at which point the etch process can be terminated. These thickness ranges are not indented to be limiting. By way of example and not limitation, the Si-etch process is timed based on the initial thickness of sulfide layer 300 and the etch rate of the sulfide layer. As mentioned earlier, sulfide layer growth rates and material etch rates can be obtained by experimentation.

As would be understood by a person of ordinary skill in the art, the Si-rich first material 110 can be removed before sulfide layer 500 reaches a thickness of about 0.5 nm to 2 nm or when sulfide layer 500 reaches a thickness of about 0.5 nm to 2 nm. Referring to FIG. 7, Si-rich first material 110 has been removed by the Si-etch process leaving behind the Ge-rich second material 120 with the remaining sulfide layer 700. The remaining sulfide layer 700 covers exposed surfaces of second material 120 except the locations where the first and second materials were in contact during the etch. The remaining sulfide layer 700 can be removed with another cycle of etch. This is can be achieved because the etch rate for the sulfide layer can be greater than the etch rate for the Ge-rich material, as discussed above.

As would be understood by a person of ordinary skill in the art, several etch-growth-etch cycles may be necessary to remove Si-rich material 110. The number or cycles is based on, for example, the physical thickness of the chalcogenide layers, their offset thickness at the beginning of each cycle, their respective etch rates, and the etch rate selectivity. However, as would be understood by a person of ordinary skill in the art, the greater the thickness offset between the two chalcogenide layers, the fewer the etch-growth-etch cycles required for the removal of the Si-rich material.

Various embodiments in accordance with this disclosure provide methods that favor Si-rich material etch so that Si-rich layers can be selectively removed from Si-rich/Ge-rich stacks. Various embodiments use one or more cycles of sulfurization and etch operations to selectively remove the Si-rich material. According to some embodiments, several sulfurization and etch cycles may be necessary to remove the Si-rich material from the stack. Therefore, embodiments in accordance with this disclosure provide methods to selectively etch the Si-rich material and leave the Ge-rich material un-etched.

In some embodiments, a method includes a multilayer stack formed with alternating layers of a silicon-rich material and a germanium-rich material. A first chalcogenide layer is concurrently formed on the silicon-rich material, and a second chalcogenide layer on the germanium-rich material. Further, the second chalcogenide layer is thicker than the first chalcogenide layer. The first chalcogenide layer and the second chalcogenide layer are etched until the first chalcogenide layer is removed from the silicon-rich material. The silicon-rich material and the second chalcogenide layer are etched. The silicon-rich material and the second chalcogenide layer are having different etch rates.

In some embodiments, a method includes a multilayer stack formed with a substantially germanium-free material disposed on top of a germanium-rich material. A chalcogenide layer is grown on the germanium-rich material. The substantially germanium-free material and the chalcogenide layer are etched. Further, the substantially germanium-free first material and the chalcogenide layer have different etch rates.

In some embodiments, a nanowire channel finFET structure includes a fin disposed on a substrate; and a gate stack with a first side surface and a second side surface disposed on the fin. A first source/drain that is substantially aligned to the first side of the gate stack region, is formed in the fin and; a second source/drain region that is substantially aligned to the second side of gate stack, is formed in the fin. A germanium-rich nanowire channel that includes one or more germanium-rich nanowires, is disposed between the first and the second source/drain regions.

It is to be appreciated that the Detailed Description section, and not the Abstract of the Disclosure section, is intended to be used to interpret the claims. The Abstract of the Disclosure section may set forth one or more but not all possible embodiments of the present disclosure as contemplated by the inventor(s), and thus, are not intended to limit the subjoined claims in any way.

The foregoing disclosure outlines aspects of several embodiments so that those skilled in the art may better understand the aspects of the present disclosure. Those skilled in the art will appreciate that they may readily use the present disclosure as a basis for designing or modifying other processes and structures for carrying out the same purposes and/or achieving the same advantages of the embodiments introduced herein. Those skilled in the art will also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   forming a multilayer stack comprising alternating layers of a silicon-rich material and a germanium-rich material;
   concurrently growing a first chalcogenide layer on the silicon-rich material and a second chalcogenide layer on the germanium-rich material, wherein the second chalcogenide layer is thicker than the first chalcogenide layer;
   etching the first chalcogenide layer and the second chalcogenide layer until the first chalcogenide layer is removed from the silicon-rich material; and
   etching the silicon-rich material and the second chalcogenide layer, wherein the silicon-rich material and the second chalcogenide layer have different etch rates.

2. The method of claim 1, further comprising:
   after etching the silicon-rich material and the second chalcogenide layer, re-growing a third chalcogenide layer on the silicon-rich material and a fourth chalcogenide layer on the second chalcogenide layer of the germanium-rich material, wherein the fourth and second chalcogenide layers on the germanium-rich material form a fifth chalcogenide layer that is thicker than the third chalcogenide layer on the silicon-rich material;
   etching the third chalcogenide layer and the fifth chalcogenide layer until the third chalcogenide layer is removed; and
   etching the silicon-rich material and the fifth chalcogenide layer until the silicon-rich material is removed from the multilayer stack, wherein the silicon-rich material and the fifth chalcogenide layer have different etch rates.

3. The method of claim 1, wherein the growing the first and second chalcogenide layers comprises growing the first and second chalcogenide layers by exposing the silicon-rich material and the germanium-rich material to an ammonium sulfide $((NH_4)_2S)$ solution at a temperature between 20° C. and 100° C.

4. The method of claim 1, wherein the growing the first and second chalcogenide layers comprises growing the first and second chalcogenide layers by annealing the silicon-rich material and the germanium-rich material in hydrogen sulfide $(H_2S)$ vapors at an annealing temperature between 200° C. and 800° C.

5. The method of claim 1, wherein the silicon-rich material comprises silicon germanium $Si_xGe_{1-x}$ and the germanium-rich material comprises $Si_yGe_{1-y}$, wherein $0 \leq x \leq 1$, $0 \leq y \leq 1$, and $x > y$.

6. The method of claim 1, wherein the germanium-rich material comprises more than 50% germanium and less than 50% silicon.

7. The method of claim 1, wherein the first and second chalcogenide layers comprise germanium sulfide, germanium selenide, or germanium telluride.

8. The method of claim 1, wherein the etching the silicon-rich material and the second chalcogenide layer comprises etching the silicon-rich material faster than the second chalcogenide layer.

9. The method of claim 1, wherein the etching the first and second chalcogenide layers comprises etching the first and second chalcogenide layers using a dry etch process, a wet etch process, or a combination thereof.

10. A method comprising:
    forming a multilayer stack comprising a substantially germanium-free material disposed on top of a germanium-rich material;
    growing a chalcogenide layer on the germanium-rich material; and
    etching the substantially germanium-free material and the chalcogenide layer, wherein the substantially germanium-free material and the chalcogenide layer have different etch rates.

11. The method of claim 10, further comprising:
    after etching the substantially germanium-free material and the chalcogenide layer, re-growing another chalcogenide layer on the chalcogenide layer of the germanium-rich material, wherein the chalcogenide layer of the germanium-rich material and the another chalcogenide layer form a third chalcogenide layer; and etching the third chalcogenide layer and the substantially germanium-free material until the substantially germanium-free material is removed from the multilayer stack.

12. The method of claim 10, wherein the substantially germanium-free material comprises more than 95% silicon.

13. The method of claim 10, wherein the germanium-rich material comprises more than 50% germanium and less than 50% silicon.

14. The method of claim 10, wherein the chalcogenide layer comprises germanium sulfide, germanium selenide, or germanium telluride.

15. The method of claim 10, wherein the etching the substantially germanium-free material and the chalcogenide layer comprises etching the substantially germanium-free material faster than the chalcogenide layer.

16. The method of claim 10, wherein the etching the chalcogenide layer comprises etching the chalcogenide layer using a dry etch process, a wet etch process, or a combination thereof.

17. A method comprising:

forming a multilayer stack comprising alternating layers of a first material and a second material in a channel region of a fin field effect transistor (finFET), wherein the first material comprises $Si_xGe_{1-x}$ and the second material comprises $Si_yGe_{1-y}$ with $0 \leq x \leq 1$, $0 \leq y \leq 1$, and $x > y$;

concurrently growing a first sulfide layer on the first material and a second sulfide layer on the second material, wherein the second sulfide layer is thicker than the first sulfide layer;

etching the first sulfide layer and the second sulfide layer until the first sulfide layer is removed from the first material; and etching the first material and the second sulfide layer until the first material is removed.

18. The method of claim 17, wherein the concurrently growing the first and the second sulfide layers comprises exposing the first and the second materials to an ammonium sulfide $((NH_4)_2S)$ solution at a temperature between 20° C. and 100° C.

19. The method of claim 17, wherein the concurrently growing the first and the second sulfide layers comprises annealing the first and the second materials in hydrogen sulfide $(H_2S)$ vapors at an annealing temperature between 200° C. and 800° C.

20. The method of claim 17, wherein the multilayer stack has a width equal to a width of the channel region of the finFET.

* * * * *

UNITED STATES PATENT AND TRADEMARK OFFICE
CERTIFICATE OF CORRECTION

PATENT NO. : 10,002,922 B1
APPLICATION NO. : 15/669064
DATED : June 19, 2018
INVENTOR(S) : Colinge et al.

Page 1 of 1

It is certified that error appears in the above-identified patent and that said Letters Patent is hereby corrected as shown below:

On the Title Page

Column 1, Item (*), in "Notice", Line 3, delete "days. days." and insert -- days. --, therefor.

Signed and Sealed this
Ninth Day of July, 2019

Andrei Iancu
*Director of the United States Patent and Trademark Office*